US008587340B2

(12) United States Patent
Lin

(10) Patent No.: US 8,587,340 B2
(45) Date of Patent: Nov. 19, 2013

(54) APPARATUSES INCLUDING SCALABLE DRIVERS AND METHODS

(75) Inventor: Feng Lin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/431,674

(22) Filed: Mar. 27, 2012

(65) Prior Publication Data
US 2013/0257489 A1 Oct. 3, 2013

(51) Int. Cl.
H03K 19/0175 (2006.01)
(52) U.S. Cl.
USPC .............. 326/82; 326/41; 326/47; 326/101; 257/774; 257/777
(58) Field of Classification Search
USPC ............. 326/37–41, 47, 101; 365/189.05, 365/189.18; 257/773–774, 777
See application file for complete search history.

(56) References Cited

U.S. PATENT DOCUMENTS

| 7,796,446 | B2* | 9/2010 | Ruckerbauer et al. ... 365/189.05 |
| 2010/0060310 | A1* | 3/2010 | Laisne et al. .................... 326/10 |
| 2010/0121994 | A1 | 5/2010 | Kim et al. |
| 2011/0006391 | A1 | 1/2011 | Lee et al. |
| 2011/0110064 | A1* | 5/2011 | Foster et al. .................. 361/803 |
| 2011/0161748 | A1* | 6/2011 | Casper et al. ................. 714/708 |
| 2011/0260331 | A1 | 10/2011 | Lee |
| 2012/0248438 | A1* | 10/2012 | Lung et al. ...................... 257/48 |

OTHER PUBLICATIONS

You, Jhih-Wei, et al., "Performance Characterization of TSV in 3D IC via Sensitivity Analysis", 2010 19th IEEE Asian Test Symposium, (2010), 389-394.

* cited by examiner

Primary Examiner — Jason M Crawford
(74) Attorney, Agent, or Firm — Schwegman, Lundberg & Woessner, P.A.

(57) ABSTRACT

Apparatuses and methods are described that include a plurality of drivers corresponding to a single via. A number of drivers can be selected to operate individually or together to drive a signal through a single via. Additional apparatus and methods are described.

30 Claims, 5 Drawing Sheets

APPARATUSES INCLUDING SCALABLE DRIVERS AND METHODS

BACKGROUND

In semiconductor devices, there is continuous pressure in industry to reduce component dimensions and fit more components in a given amount of chip area. As dimensions shrink, numerous technical hurdles become more significant.

In many electronic systems, particularly in mobile systems, there may be competing goals of increasing device speed versus decreasing power consumption. It is desirable to provide reduced power consumption without sacrificing speed. Improved electronic systems are desired to meet these and other challenges with efficient manufacturing processes.

DETAILED DESCRIPTION

In the following detailed description of various embodiments of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and structural, logical, and electrical changes may be made.

Integrated circuits (ICs) may include many devices and circuit members that are formed on a single semiconductor die. The current trends in IC technology are towards faster and more complicated circuits. However, as more complex ICs are manufactured, various speed-related problems become more apparent. This is especially true when ICs having different functions are used to create electronic systems, for example, computing systems including processor and memory ICs, where different ICs are electrically connected by a network of global interconnects. As global interconnects become longer and more numerous in electronic systems, resistive-capacitive (RC) delay and power consumption, as well as system performance, tend to become limiting factors.

One proposed solution to these problems is three-dimensional (3-D) integration or packaging technology. 3-D integration refers to the vertical stacking of multiple dice (e.g., chips) including ICs within a package. In some 3-D integration technology, multiple dice are coupled (e.g., electrically connected) using through silicon vias (TSVs) that form vertical connectors or 3-D conductive structures. TSVs extend (at least partially) through a thickness of one or more of the dice and may be aligned when the die are stacked to provide electrical communication among the ICs in the stack. Such TSVs are often formed of a conductive material, such as aluminum or copper. 3-D integration typically results in a reduction of the packaged IC's footprint as well as a reduction in power consumption, and an increase in performance.

In many electronic systems, including mobile systems, there may be competing goals of increasing device speed and decreasing power consumption. It is sometimes desirable to provide reduced power consumption without sacrificing speed. In some cases, efficient manufacturing processes may be used to help achieve these goals.

Figure 1:
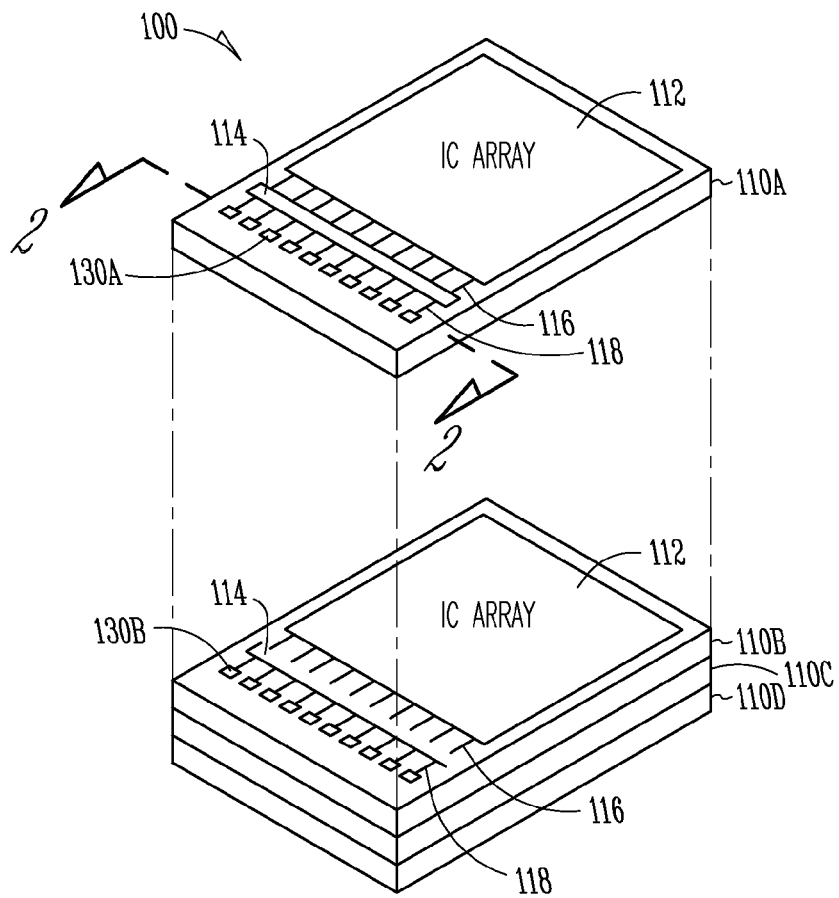
FIG. 1 shows an isometric view of a semiconductor device according to an embodiment of the invention.
Figure 2:
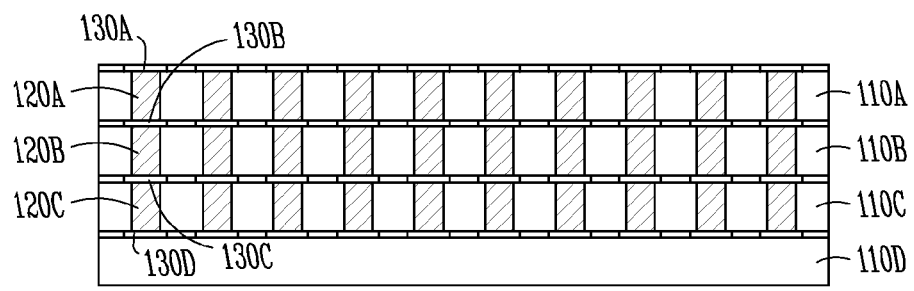
FIG. 2 shows a cross section of the semiconductor device from FIG. 1, along line 2-2 according to an embodiment of the invention.

Referring to FIGS. 1 and 2, an example 3-D IC device will now be described. The illustrated 3-D IC device 100 includes four dice 110a-110d stacked over one another. Although a four die configuration is shown in FIG. 1, other configurations may include fewer stacked dice, or more stacked dice, such as 8 stacked dice, for example. The first die 110a is the uppermost die, and the fourth die 110d is the lowermost die. The second and third dice 110b, 110c are interposed between the first and fourth dice 110a, 110d. In other examples, a 3-D IC device can include a greater or lesser number of dice than the device of FIG. 1.

One or more of the first to fourth dice 110a-110d may include an IC array 112, a transceiver 114, first interconnect lines 116, second interconnect lines 118 and landing pads 130a-130d. Each of the dice 110a-110c, may also include vias 120a-120c (FIG. 2).

In silicon examples, the via may be termed a TSV. Although the term TSV refers to dice formed from silicon, one of ordinary skill in the art, having the benefit of the present disclosure, will recognize that other semiconductor materials may be used in fabricating dice, and the term TSV applies to other vertical connectors or 3-D conductive structures that pass at least partially through dice of different materials. In one example, as illustrated in FIG. 1, the lowermost die 110d does not include a via. In one example, the lowermost die may include a logic die without vias. In other examples, the lowermost die may include one or more vias.

The IC array 112 may include one or more integrated circuits, including, but not limited to, one or more memory cells (for example, volatile and/or non-volatile memory cells) and one or more processors. In one example, one or more of the dice 110a-110d comprises a memory die. Examples of memory dice include dynamic random access memory (DRAM) dice, static random access memory (SRAM) dice, flash memory dice, resistive random access memory (RRAM) dice etc. 3-D memory configurations using DRAM configurations are advantageous in complex processing operations due to their relative high access and programming speed.

In one example, one or more of the dice 110a-110d includes a logic die. One example of a logic die includes a die including processing circuitry, addressing circuitry, or other memory management circuitry. In one example, a logic die does not include a memory array. One example of a 3-D IC device 100 includes a number of stacked memory dice and a single logic die (which may or may not be stacked with the memory dice). In one example, the logic die is located on the edge of the stack of dice, such as to provide easier access to the logic die.

The first interconnect lines 116 provide data paths between the IC array 112 and the transceiver 114 on a respective one of the dice 110a-110d. The second interconnect lines 118 provide data paths between the transceiver 114 and the landing pads 130a-130d of a respective one of the dice 110a-110d.

The vias 120a-120c provide communication paths between the landing pads 130a-130d of dice 110a-110d that are stacked immediately next to each other, thereby completing parts of data paths between the IC arrays 112 on the two dice. In certain cases, the vias 120a-120c of two or more dice 110a-110d that are stacked over one another are aligned in series, and can together provide serial data paths among the two or more dice.

Figure 3:
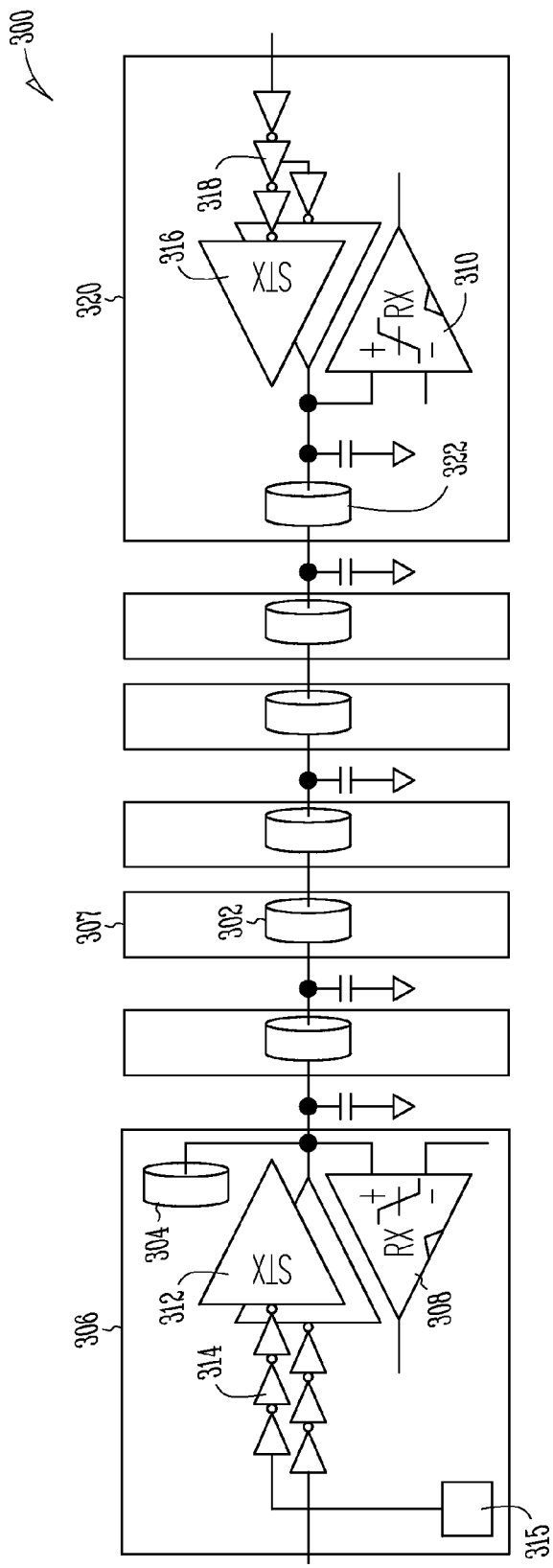
FIG. 3 shows a block diagram of a semiconductor device according to an embodiment of the invention.

FIG. 3 shows an example of a block diagram for a stack of eight dice 300 according to an embodiment of the invention. Although eight dice are illustrated in the block diagram configuration, other configurations may include fewer dice or more dice than eight.

A number of vias 302 are illustrated. Each via 302 corresponds to a die 307 in a stack of semiconductor dice, similar to the stack of dice 110a-110d shown in FIGS. 1 and 2. In one example, vias 302 are configured similar to vias 120a-120c from FIGS. 1 and 2. Via 304 is included in die 306 in the stack of dice, and is illustrated to be within the same die 306 as drivers 312, pre-drivers 314 and a receiver 308.

FIG. 3 shows a plurality of drivers 312 corresponding to a single via 304 in the die 306. One or more of the drivers 312 are selectable to operate individually or together (e.g., in parallel) to drive a signal through vias 304, 302 to a selected die in the stack of dice 300. A receiver 308 is shown, and is operable to receive a signal from other dice 307 in the stack of dice 300. In one example, the drivers 312 and receiver 308 are located in a transceiver, such as transceiver 114 from FIG. 1. The block diagram of FIG. 3 is simplified for ease of illustration. Each die 307 may include not only the vias 302, but also drivers and a receiver in a transceiver, such as transceiver 114.

The example of FIG. 3 further shows an embodiment that includes one or more pre-drivers 314. A pre-driver may be coupled to one or more of the drivers 312 to improve speed and/or performance in signal transmission. In one example, one or more pre-drivers 314 are staggered with an associated driver 312 to reduce a slew rate in a signal. In one example, timing for an enable signal for each driver (through the pre-driver) is staggered, which in turn makes the signal transition smoother at a final output. Configurations with slew rate control may reduce overshoot and/or undershoot of the output and improve signaling.

In one example, a plurality of pre-drivers 314 are associated with a corresponding plurality of drivers 312, in a one-to-one correspondence. In another example, one pre-driver is associated with a plurality of drivers. For example, FIG. 3 illustrates a second plurality of drivers 316 in a die 320 corresponding to a single via 322. A single pre-driver 318 is associated with the plurality of drivers 316. Similar to die 306, die 320 is also shown with a receiver 310.

Configurations with a plurality of drivers that correspond to a single via provide flexibility in driving signals in stacks of different numbers of dice. For example, in order to drive a signal in an eight die stack, a driver may be configured to provide enough power to drive the signal through at least seven dice to ensure that the largest possible distance is covered. However, if the same driver configuration is used in a four die stack, the additional power capability is wasted. A lower power configuration can thus provide power savings in a four die stack. Configurations such as FIGS. 3 and 4 with a plurality of drivers that correspond to a single via can be configured to use multiple drivers when needed to drive signals in large stacks of dice, and configured to use fewer drivers in smaller stacks of dice when the additional power drive capability is not needed.

Figure 4:
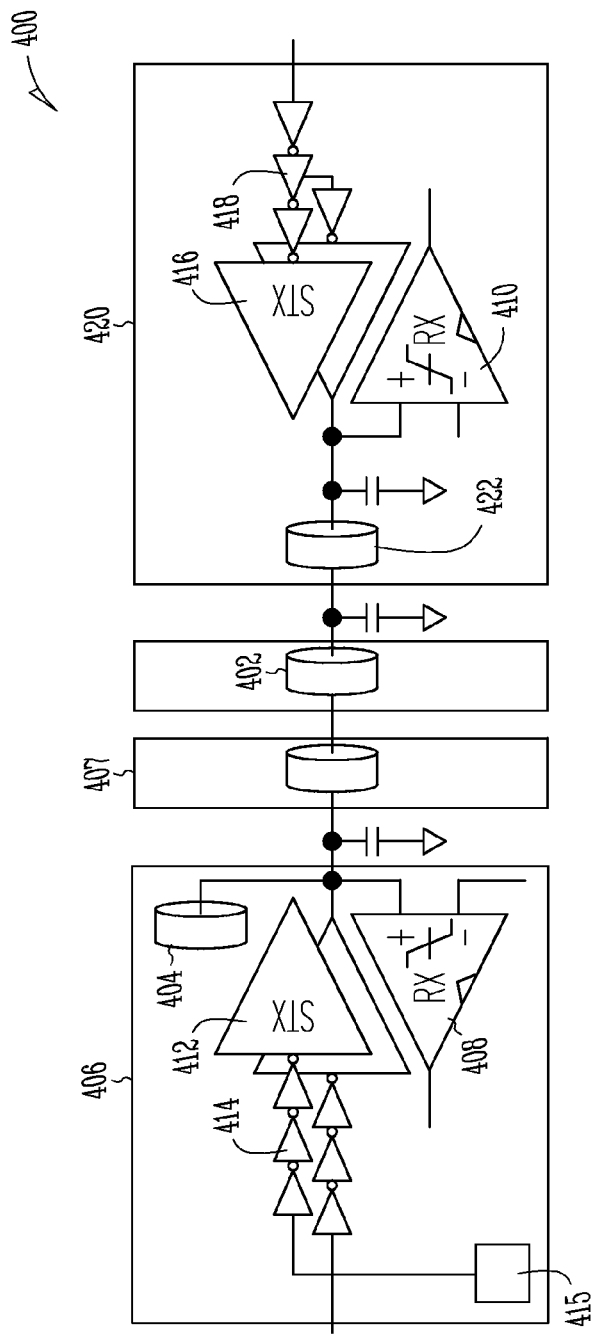
FIG. 4 shows a block diagram of another semiconductor device according to an embodiment of the invention.

For example, FIG. 4 shows an example of a block diagram for a stack of four dice 400 according to an embodiment of the invention. A number of vias 402 are illustrated. Each via 402 corresponds to a die 407 in the stack of semiconductor dice, as in FIG. 3. Via 404 is included in die 406 in the stack of dice 400, and is illustrated to be within the same die 406 as drivers 412, pre-drivers 414 and a receiver 408. Similar to FIG. 3, in one example, a plurality of pre-drivers 414 are included, with a pre-driver 414 associated with each driver 412 in the plurality of drivers. Also similar to FIG. 3, a second plurality of drivers 416 in a die 420 corresponding to a single via 422. A single pre-driver 418 is associated with the plurality of drivers 416. Similar to die 406, die 420 is also shown with a receiver 410.

In one example, the die 406 is substantially identical to die 306 from FIG. 3. The number of drivers 412, 312 that are used can be selected to correspond to power needs in an eight die stack, as in FIG. 3, or a four die stack as in FIG. 4, or in stacked die configurations with other numbers of dice. A single die configuration can be manufactured, with a selectable number of drivers to meet performance goals, and at the same time reduce power needs to accommodate the number of dice in the stack.

Returning to FIG. 3 as an example, in one embodiment, there are two drivers 312 in the plurality of drivers. In other examples, three or more drivers 312 may be included in the number of drivers. Other numbers of drivers may be included, depending on the degree of flexibility desired for numbers of dice in a stacked die device.

In one example, the drivers 312 are substantially equal in size. For example a single driver may be used to drive a signal in a four die stack, and an additional second driver of substantially equal size may be added to the first driver to provide the capability to drive the signal in an eight die stack. In another example, the drivers are not substantially equal in size. For example a single driver may be used to drive a signal in a two die stack, and an additional second driver of greater size may be added to provide the capability to drive the signal in an eight die stack.

In one example the plurality of drivers may be in one die within the stack of dice. The die with the plurality of drivers may be a logic die coupled to a plurality of memory dice. In other examples, each die in the stack of dice includes a plurality of drivers as described in embodiments above. One advantage of including a plurality of drivers in each die includes manufacturing efficiency. One physical die configuration can be manufactured, and later electrically configured to use one or more drivers in a plurality of drivers to efficiently power any selected number of dice in a 3-D stacked configuration.

FIG. 3 shows a selector 315 that can used to select a number of drivers 312 and/or pre-drivers 314. In one example, the selector 315 is actuated at the time of manufacture. In another example, the selector 315 is actuated at power up, for example, using instructions from a host processor (not shown). FIG. 4 is shown also including a selector 415 that can used to select a number of drivers 412 and/or pre-drivers 414. In one example, a single driver is selected by default (e.g., it is configured to be always enabled when in operation), and an additional driver(s) may be selectably added to meet the needs of larger numbers of dice in a stack of dice. In other words, an additional driver is configured to be optionally selected.

Figure 5:
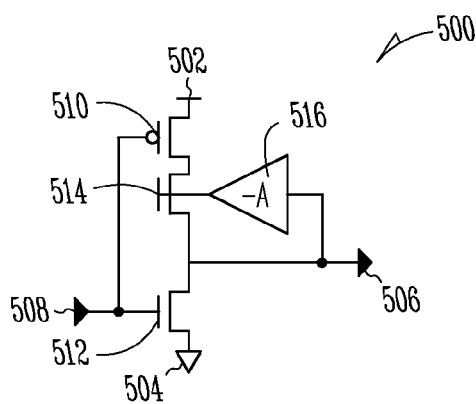
FIG. 5 shows a schematic diagram of an example driver according to an embodiment of the invention.

FIG. 5 shows one example of a driver 500 that may be used to form a plurality of drivers, as in example configuration such as those shown in FIG. 3 or 4. The driver 500 includes a first voltage supply node 502, a second voltage (e.g., ground) supply node 504, and an input 508. The example driver 500 of FIG. 5 includes a P channel transistor 510 and an N channel transistor 512 that operate with a single input signal from input 508. A feedback transistor 514 is driven by a feedback circuit 516 to control the voltage at output 506.

Figure 6:
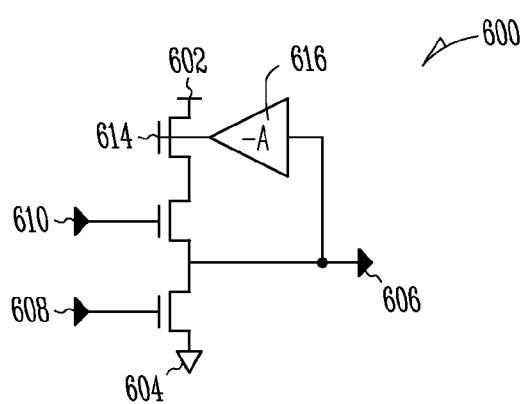
FIG. 6 shows a schematic diagram of another example driver according to an embodiment of the invention.

FIG. 6 shows an example of another driver 600 that may be used to form a plurality of drivers, as in example configuration such as those shown in FIG. 3 or 4. The driver 600 includes a first voltage supply node 602 a second voltage (e.g., ground) supply node 604, a first input 608, and a second input 610. The example driver 600 of FIG. 6 uses the first and second inputs 608, 610 to select a high or low signal to be transmitted to an output 606. A feedback transistor 614 is driven by a feedback circuit 616 to control the voltage at output 606.

Figure 7:
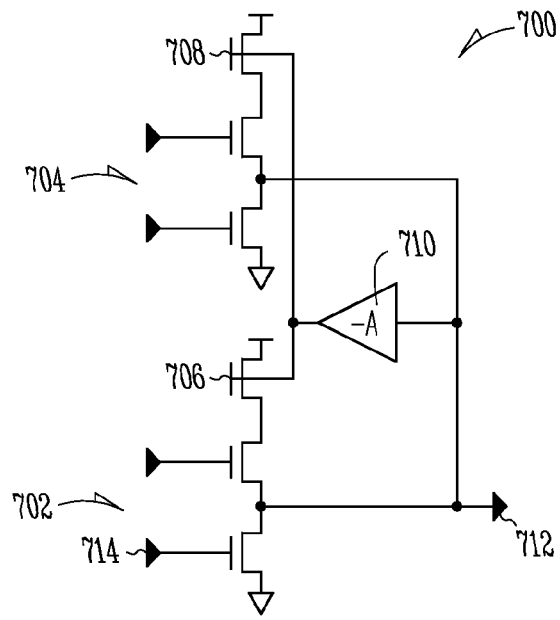
FIG. 7 shows a schematic diagram of drivers according to an embodiment of the invention.

FIG. 7 shows one example of a plurality of drivers 700, including a first driver 702 and a second driver 704 similar to the driver 600 from FIG. 6. The first driver 702 includes a first feedback transistor 706 and the second driver 704 includes a second feedback transistor 708. A number of inputs 714 are used to control the high or low level at the output 712. The inputs 714 are selected by a selector similar to selectors 315, 415 from FIGS. 3 and 4 to turn drivers and/or pre-drivers on or off. A swing level is dictated by feedback circuit 710.

The configuration of FIG. 7 uses a shared feedback circuit 710 coupled to both the first feedback transistor 706 and the second feedback transistor 708. Configurations with a shared feedback circuit 710 may provide greater efficiency of power and reduced circuit real estate on the die.

Figure 8:
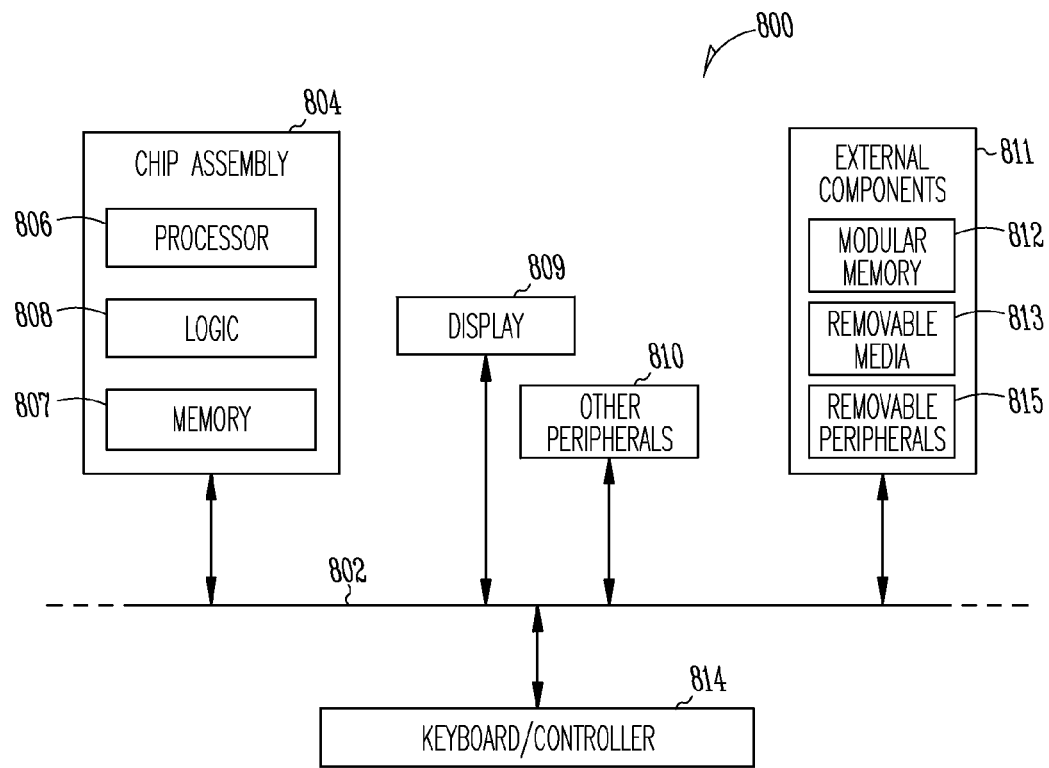
FIG. 8 shows an information handling system, including a memory device according to an embodiment of the invention.

As used herein, the term "apparatus" is used to refer to a variety of structures and configurations, including, without limitation, systems, devices, circuitry, chip assemblies, etc. An embodiment of an apparatus such as a computer is included in FIG. 8 to show an embodiment of a high-level device application. FIG. 8 is a block diagram of an apparatus 800 incorporating at least one 3-D IC device 804 according to an embodiment of the invention. The apparatus 800 shown in FIG. 8 is merely one example of a system in which the present invention can be used. Other examples include, but are not limited to, mainframe systems, tablet computers, personal data assistants (PDAs), cellular telephones, MP3 players, aircraft, satellites, military vehicles, etc.

In this example, apparatus 800 comprises a data processing system that includes a system bus 802 to couple the various components of the system. System bus 802 provides communications links among the various components of the information handling system 800 and may be implemented as a single bus, as a combination of busses, or in any other suitable manner.

Chip assembly 804 is coupled to the system bus 802. Chip assembly 804 may include any circuit or operably compatible combination of circuits. In one embodiment, chip assembly 804 includes a processor 806 that can be of any type. As used herein, "processor" means any type of computational circuit such as, but not limited to, a microprocessor, a microcontroller, a graphics processor, a digital signal processor (DSP), or any other type of processor or processing circuit. Multiple processors such as "multi-core" devices are also within the scope of embodiments of the invention.

In one embodiment, a memory device 807, such as a 3-D semiconductor device described in embodiments above, is included in the chip assembly 804. Those of ordinary skill in the art will recognize that a wide variety of memory device configurations may be used in the chip assembly 804. Acceptable types of memory chips include, but are not limited to, Dynamic Random Access Memory (DRAMs) such as SDRAMs, SLDRAMs, RRAMs and other DRAMs. Memory chip 807 can also include non-volatile memory such as NAND memory or NOR memory.

In one embodiment, additional logic chips 808 other than processor chips are included in the chip assembly 804. An example of a logic chip 808 other than a processor includes an analog to digital converter. Other circuits on logic chips 808 such as custom circuits, an application-specific integrated circuit (ASIC), etc. are also included in one embodiment of the invention.

Apparatus 800 may also include an external memory 811, which in turn can include one or more memory elements suitable to the particular application, such as one or more hard drives 812, and/or one or more drives that handle removable media 813 such as floppy diskettes, compact disks (CDs), digital video disks (DVDs), and the like. A memory constructed as described in examples above is included in the apparatus 800.

Apparatus 800 may also include a display device 809 such as a monitor, additional peripheral components 810, such as speakers, etc. and a keyboard and/or controller 814, which can include a mouse, or any other device that permits a system user to input information into and receive information from the apparatus 800.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. An apparatus, comprising a plurality of semiconductor dice, wherein:
   at least some of the plurality of semiconductor dice are stacked and coupled by vias; and
   at least one of the plurality of semiconductor dice includes a plurality of drivers corresponding to a single via of the plurality of vias, wherein one or more of the plurality of drivers are selectable to operate individually or together to drive a signal through the single via;
   wherein one driver of the plurality of drivers is configured to be always enabled when in operation, and an additional driver of the plurality of drivers is configured to be optionally selected.

2. The apparatus of claim 1, wherein the stacked semiconductor dice includes a plurality of memory dice.

3. The apparatus of claim 2, wherein the stacked semiconductor dice include a number of dynamic random access memory dice.

4. The apparatus of claim 1, wherein the stacked semiconductor dice includes a logic die.

5. The apparatus of claim 1, wherein the plurality of semiconductor dice includes a logic die, and further including a host processor coupled to the logic die.

6. The apparatus of claim 1, further comprising shared feedback circuitry between the plurality of drivers.

7. The apparatus of claim 1, wherein the plurality of drivers are substantially equal in size.

8. The apparatus of claim 1, wherein one driver of the plurality of drivers is configured to drive the signal in a stack of four dice, and when all of the plurality drivers are selected, the plurality of drivers are configured to drive the signal in a stack having eight dice.

9. The apparatus of claim 1, wherein the plurality of drivers is two drivers.

10. An apparatus comprising a stack of memory chips coupled by vias, wherein the apparatus comprises:
   a plurality of drivers corresponding to a single via of the plurality of vias, wherein one or more drivers in the plurality of drivers are selectable to operate individually or together to drive a signal through the via to one or more of the chips in the stack of memory chips, wherein one driver of the plurality of drivers is configured to be always enabled when in operation, and an additional driver of the plurality of drivers is configured to be optionally selected; and
   a pre-driver coupled to at least one of the plurality of drivers.

11. The apparatus of claim 10, wherein the pre-driver is coupled to each driver of the plurality of drivers.

12. The apparatus of claim 10, wherein the pre-driver is staggered to provide slew rate control.

13. The apparatus of claim 10, wherein the plurality of drivers is two drivers and the pre-driver comprises two pre-drivers, wherein each of the two pre-drivers is associated with a respective one of the two drivers.

14. The apparatus of claim 10, wherein the stack of memory chips are coupled with a logic die, wherein the logic die includes the plurality of drivers and the pre-driver.

15. The apparatus of claim 14, wherein the logic die is stacked with the stack of memory chips.

16. The apparatus of claim 10, wherein the plurality of drivers and the pre-driver are in a memory chip of the stack of memory chips.

17. A semiconductor chip, comprising:
   a plurality of drivers corresponding to a single via of a plurality of vias, wherein the single via is to pass a signal through at least a portion of a thickness of a semiconductor chip, wherein one driver of the plurality of drivers is configured to be always enabled when in operation, and an additional driver of the plurality of drivers is configured to be optionally selected; and
   a selector to enable one or more of the plurality of drivers to operate individually or together to drive a signal through the single via.

18. The semiconductor chip of claim 17, further including a pre-driver associated with each driver in the plurality of drivers.

19. The semiconductor chip of claim 18, wherein the pre-driver is staggered to reduce a slew rate in its associated driver.

20. The semiconductor chip of claim 17, wherein the plurality of drivers comprise two drivers.

21. The semiconductor chip of claim 17, wherein the plurality of drivers are substantially equal in size.

22. The semiconductor chip of claim 17, wherein the plurality of drivers share feedback circuitry.

23. A method of operating an apparatus comprising a plurality of semiconductor dice, wherein at least some of the plurality of semiconductor dice are stacked and coupled by vias and at least one of the plurality of semiconductor dice includes a plurality of drivers corresponding to a single via of the plurality of vias, comprising:
   selecting one or more of the plurality of drivers to operate individually or together to drive a signal through the single via, wherein selecting one or more of the plurality of drivers to operate individually or together to drive a signal through the single via comprises selecting the one or more of the plurality of drivers at a time of manufacture of the apparatus.

24. The method of claim 23, wherein at least some of the plurality of semiconductor dice that are stacked are memory dice.

25. The method of claim 23, wherein the at least one of the plurality of semiconductor dice is a logic die.

26. The method of claim 23, wherein selecting one or more of the plurality of drivers to operate individually or together comprises electrically configuring the plurality of drivers.

27. The method of claim 23, wherein selecting one or more of the plurality of drivers to operate individually or together to drive a signal through the single via comprises selecting the one or more of the plurality of drivers to operate individually or together to drive the signal through the single via responsive to instructions received from a host processor.

28. A method of operating an apparatus comprising a plurality of semiconductor dice, wherein at least some of the plurality of semiconductor dice are stacked and coupled by vias and at least one of the plurality of semiconductor dice includes a plurality of drivers corresponding to a single via of the plurality of vias, comprising:
   selecting one or more of the plurality of drivers to operate individually or together to drive a signal through the single via, wherein selecting one or more of the plurality of drivers to operate individually or together to drive a signal through the single via comprises selecting the one or more of the plurality of drivers at power up of the apparatus.

29. The method of claim 28, wherein at least some of the plurality of semiconductor dice that are stacked are memory dice.

30. The method of claim 28, wherein the at least one of the plurality of semiconductor dice is a logic die.

* * * * *